United States Patent
Fukui

[19]

[11] Patent Number: 5,994,764
[45] Date of Patent: Nov. 30, 1999

[54] SEMICONDUCTOR DEVICE

[75] Inventor: Takamichi Fukui, Tokyo, Japan

[73] Assignee: NEC Corporation, Tokyo, Japan

[21] Appl. No.: 09/040,750

[22] Filed: Mar. 18, 1998

[30] Foreign Application Priority Data

Mar. 18, 1997 [JP] Japan ................................ 9-064589

[51] Int. Cl.⁶ .................... H01L 23/58; H01L 27/108; H01L 29/76; H01L 29/94; H01L 31/119
[52] U.S. Cl. ........................ 257/632; 257/296; 257/339
[58] Field of Search ............................ 257/632, 296, 257/339

[56] References Cited

U.S. PATENT DOCUMENTS 5,095,346  3/1992  Bae et al. .
5,444,653  8/1995  Nagasawa et al. .
5,717,236  2/1998  Shinkawata .

FOREIGN PATENT DOCUMENTS 4-186675  7/1992  Japan .

*Primary Examiner*—Stephen D. Meier
*Attorney, Agent, or Firm*—Foley, Hoag & Eliot LLP

[57] ABSTRACT

A semiconductor device includes a semiconductor substrate, a source and drain, a gate electrode, a first insulating underlayer, and a nitride film. The source and drain are formed on a major surface of the semiconductor substrate to be separated from each other. The gate electrode is formed on the semiconductor substrate between the source and the drain via a gate insulating film. The first insulating underlayer is formed to cover an entire surface of the semiconductor substrate including the gate electrode. The nitride film has a predetermined thickness and is formed on the first insulating underlayer so as to set a distance between the nitride film and the gate insulating film to be 20 times or less the thickness of the nitride film.

12 Claims, 2 Drawing Sheets

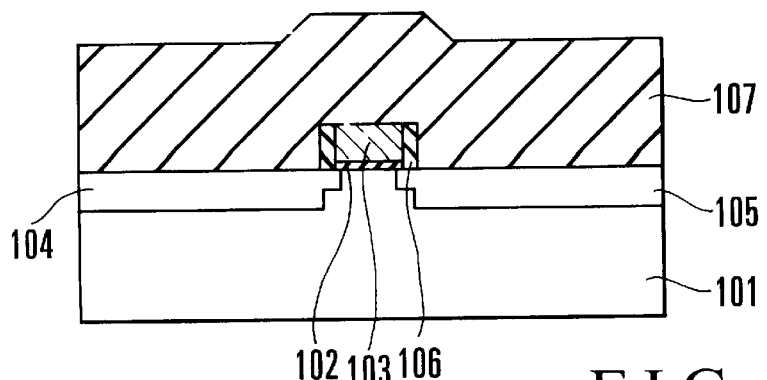
F I G. 1A
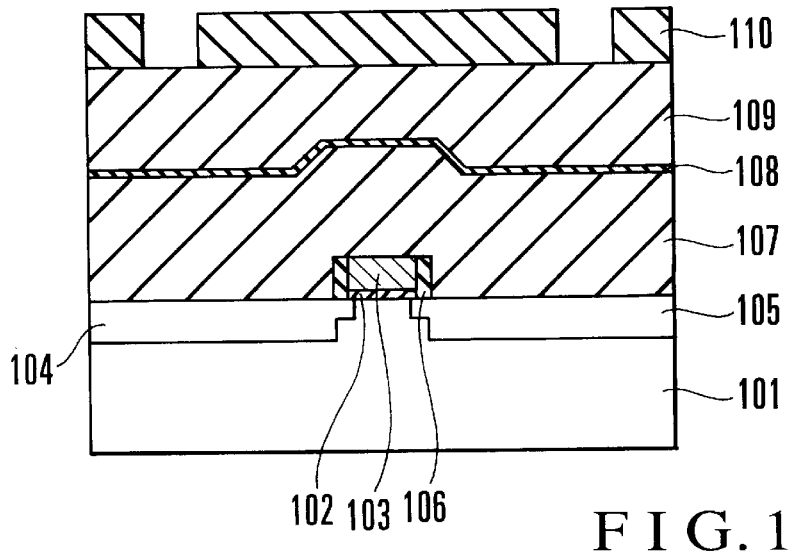
F I G. 1B
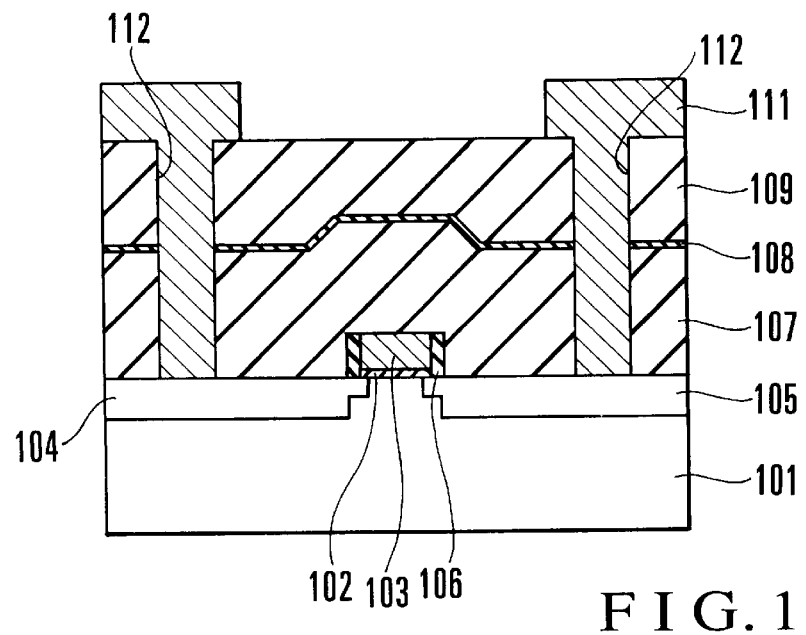
F I G. 1C

SEMICONDUCTOR DEVICE

BACKGROUND OF THE INVENTION

The present invention relates to a semiconductor device having a nitride film for preventing external hydrogen from entering the device and, more particularly, to a semiconductor device having a gate oxide film with an improved breakdown life.

Generally, a semiconductor device has a nitride film on the substrate surface to prevent external hydrogen from entering the device. FIG. 3 shows a conventional semiconductor device having a nitride film 8 on a gate electrode. Referring to FIG. 3, a source region 4 and a drain region 5 are formed on the major surface of a semiconductor substrate 1, i.e., an Si substrate to be separated from each other. A gate insulating film 2 consisting of a silicon oxide film is formed on the semiconductor substrate 1 between the source region 4 and the drain region 5. A gate electrode 3 is formed on the gate insulating film 2.

Side wall films 6 are formed on both sides of the gate insulating film 2 and the gate electrode 3 so that the diffusion layer in the semiconductor substrate 1 has an LDD (Lightly Doped Drain) structure. The gate electrode 3 and the side wall films 6 are covered with a thin oxide film 12. The entire surface of the semiconductor substrate 1 including the oxide film 12 is covered with the nitride film 8. An insulating interlayer 13 is formed on the nitride film 8, and a plasma nitride film 14 is formed on the insulating interlayer 13.

As described above, conventionally, by forming the nitride film 8 immediately above the gate electrode 3, external hydrogen is prevented from entering the device, and degradation in hot-carrier resistance is suppressed.

However, formation of the nitride film 8 immediately above the gate electrode 3 poses various problems. The stress of the nitride film 8 largely changes due to thermal hysteresis in the process of forming the insulating interlayer 13 or plasma nitride film 14 on the nitride film 8. Consequently, this stress acts on the gate insulating film 2 to decrease the reliability life of the gate insulating film 2.

SUMMARY OF THE INVENTION

It is an object of the present invention to provide a semiconductor device capable of preventing breakdown of the gate oxide film even when a stress is generated in the nitride film due to thermal hysteresis or the like.

In order to achieve the above object, according to the present invention, there is provided a semiconductor device comprising a semiconductor substrate, a source and drain formed on a major surface of the semiconductor substrate to be separated from each other, a gate electrode formed on the semiconductor substrate between the source and the drain via a gate insulating film, a first insulating underlayer formed to cover an entire surface of the semiconductor substrate including the gate electrode, and a nitride film having a predetermined thickness and formed on the first insulating underlayer so as to set a distance between the nitride film and the gate insulating film to be not less than 20 times the thickness of the nitride film.

BRIEF DESCRIPTION OF THE DRAWINGS

FIGS. 1A to 1C are sectional views showing the steps in manufacturing a semiconductor device according to an embodiment of the present invention;

DESCRIPTION OF THE PREFERRED EMBODIMENT

Figure 2:
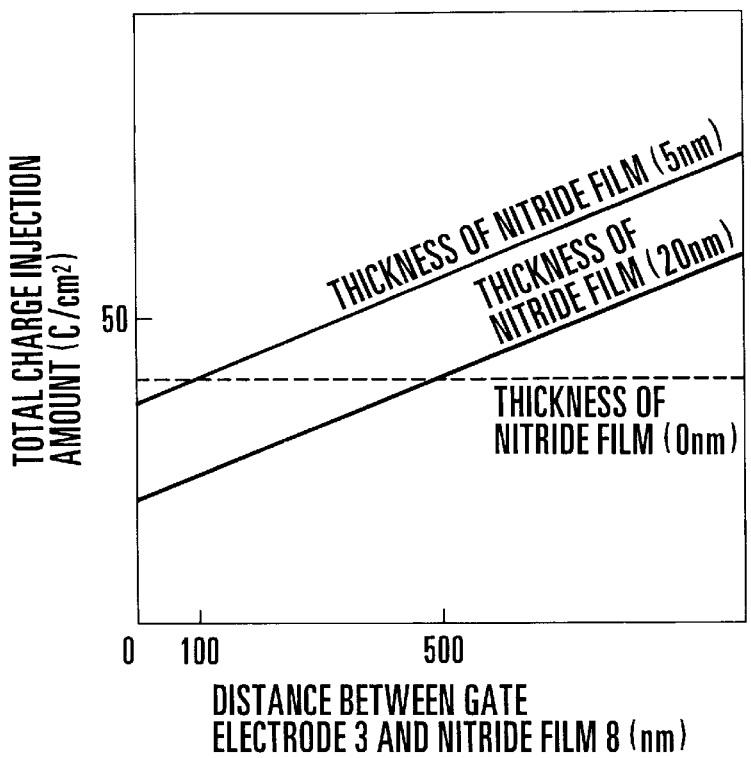
FIG. 2 is a graph showing the relationship between the breakdown charge amount of a gate electrode and the distance from a gate electrode to a nitride film in the semiconductor device shown in FIGS. 1A to 1C.
Figure 3:
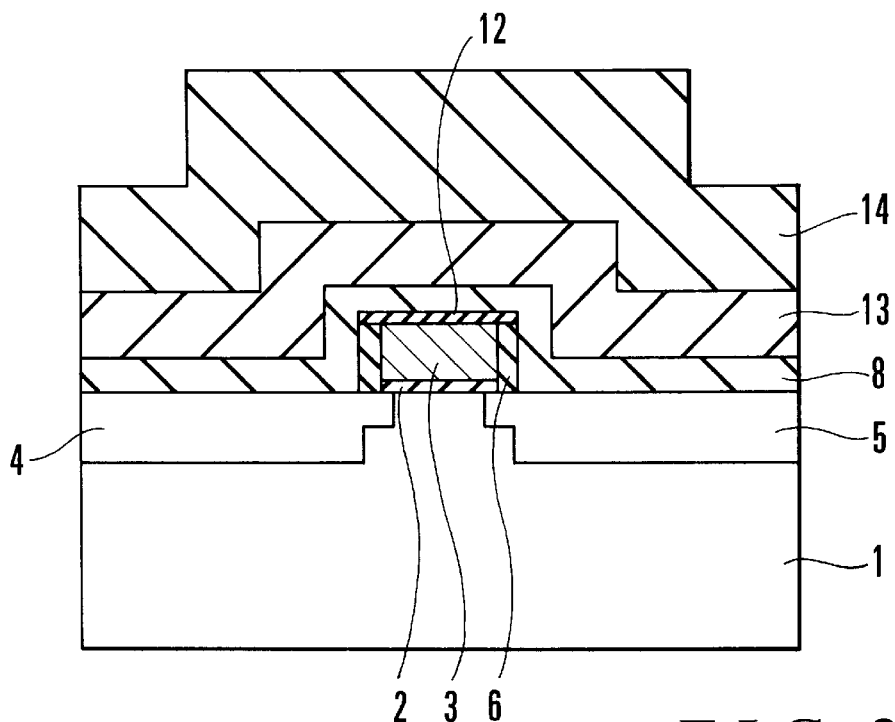
FIG. 3 is a sectional view of a conventional semiconductor device.

The present invention will be described below in detail with reference to the accompanying drawings.

FIGS. 1A to 1C show the steps in manufacturing a semiconductor device according to an embodiment of the present invention. Referring to FIG. 1A, a gate oxide film 102 (the thickness is about 3 to 15 nm) is selectively formed on a semiconductor substrate 101, i.e., an Si substrate by thermal oxidation. A conductive material (e.g., polysilicon or the like) for a gate electrode 103 on the gate oxide film 102 is deposited on the entire surface of the substrate by sputtering or CD. The gate electrode 103 is formed by lithography and dry etching.

To form a MOS (Metal Oxide Semiconductor) transistor, e.g., an NMOS transistor having an LDD structure, an n-type impurity such as phosphorus is ion-implanted into a source region 104 and a drain region 105, including regions immediately under both sides of the gate electrode 103, at a low acceleration voltage to form shallow diffusion layers. For a PMOS transistor, a p-type impurity such as boron is ion-implanted at a low acceleration voltage to form shallow diffusion layers.

After this, an oxide film is formed on the entire surface of the semiconductor substrate 101 by CVD (Chemical Vapor Deposition) and etched back to form side wall films 106 (the thickness is about 100 nm). Next, for an NMOS transistor, an n-type impurity such as arsenic is ion-implanted into the source region 104 and the drain region 105 to form deep low-resistance diffusion layers. For a PMOS transistor, a p-type impurity such as $BF_2$ is ion-implanted to form deep low-resistance diffusion layers. A first insulating underlayer 107 (the thickness is about 500 nm) is formed on the entire surface of the semiconductor substrate 101 including the gate electrode 103 and the like by CVD.

In FIG. 1B, a nitride film 108 (the thickness is about 20 nm) is formed on the first insulating underlayer 107 by LPCVD (Low Pressure CVD). A second insulating underlayer 109 (the thickness is about 500 nm) is formed on the nitride film 108 by CVD. Thereafter, the surface of the second insulating underlayer 109 is planarized by etch-back using SOG (Spin Of Glass) or CMP (Chemical Mechanical Polishing). Next, a resist 110 is applied to the entire surface of the second insulating underlayer 109 and patterned to form contacts. The thickness of the nitride film 108 is preferably kept at 5 nm or more to prevent water from the second insulating underlayer 109.

Referring to FIG. 1C, contact holes 112 reaching the surface of the semiconductor substrate 101 are formed in the second insulating underlayer 109, the nitride film 108, and the first insulating underlayer 107. The contact holes 112 are formed in correspondence with the source region 104 and the drain region 105 in the semiconductor substrate 101. An interconnection layer is sputtered on the entire surface of the second insulating underlayer 109 including the contact holes 112, and then, an interconnection pattern 111 is selectively formed by lithography and dry etching, thus completing the semiconductor device of this embodiment.

The life of the gate oxide film 102 shown in FIG. 1C will be described on the basis of experimental results. FIG. 2 shows the breakdown life of the gate oxide film 102 shown in FIGS. 1A to 1C. In FIG. 2, the distance (nm) between the gate electrode 103 and the nitride film 108, i.e., the thickness of the first insulating underlayer 107 is plotted along the abscissa, and the total charge injection amount in the gate oxide film 102 per $cm^2$ is plotted along the ordinate. This total charge injection amount represents the total amount of changes injected into the gate oxide film 102 until breakdown of the gate oxide film 102 and corresponds to the breakdown life of the gate oxide film 102.

As is apparent from FIG. 2, when the thickness of the nitride film 108 is 5 nm, a breakdown life equivalent to that in the absence of the nitride film 108 is obtained by separating the gate electrode 103 from the nitride film 108 by about 100 nm or more. In addition, as the distance between the gate electrode 103 and the nitride film 108 increases, the total charge injection amount can be increased. More specifically, the gate electrode 103 and the nitride film 108 need be separated by 100 nm/5 nm=20 (times) or more the thickness of the nitride film 108.

When the distance between the gate electrode 103 and the nitride film 108 is about 100 nm or less, the stress of the nitride film 108 largely affects the gate oxide film 102, so the total charge injection amount decreases. That is, if the gate electrode 103 is too close to the nitride film 108, the life of the gate oxide film 102 is shortened.

Due to the same reason, when the thickness of the nitride film 108 is 20 nm, the distance between the gate electrode 103 and the nitride film 108 must be kept at about 500 nm or more: the nitride film 108 and the gate electrode 103 must be separated by 500 nm/20 nm=25 (times) the thickness of the nitride film 108.

The nitride film 108 cannot be excessively thickened to prevent hydrogen from entering the device. The thickness of the nitride film 108 largely affects the characteristics and reliability of the MOS transistor. More specifically, when the thickness of the nitride film 108 exceeds 20 nm, the nitride film 108 prevents diffusion of hydrogen although the interface level density at the interface between the gate oxide film 102 and the semiconductor substrate 101 increases to make the transistor characteristics unstable.

For example, experiments revealed when the distance between the gate electrode 103 and the nitride film 108 was 150 nm, and the thickness of the nitride film 108 was 50 nm, a variation in transistor characteristics and, more particularly, a variation in threshold voltage Vt becomes almost twice that in the absence of the nitride film 108.

On the other hand, when the thickness of the nitride film 108 is smaller than 5 nm, the barrier properties of the nitride film 108 against water decrease. In a multilevel interconnection, water is diffused from the interconnection interlayer to the gate oxide film 102, resulting in slow trap (variation in characteristics in BT) or a variation in transistor characteristics such as hot carriers. Therefore, the thickness of the nitride film 108 is preferably 5 to 20 nm. In addition, the distance between the gate electrode 103 and the nitride film 108 is preferably 20 times or more the thickness of the nitride film 108.

As has been described above, according to the present invention, the thickness of the insulating underlayer formed between the gate electrode and the nitride film is set to be 20 times or more the thickness of the nitride film. With this structure, even when a stress is generated in the nitride film due to thermal hysteresis or the like, the stress acting on the gate oxide film is relaxed by the insulating underlayer. As a result, the breakdown life of the gate oxide film can be improved.

What is claimed is:

1. A semiconductor device comprising:

a semiconductor substrate;

a source and drain formed on a major surface of said semiconductor substrate to be separated from each other;

a gate electrode formed on said semiconductor substrate between said source and said drain via a gate insulating film;

a first insulating underlayer formed to cover an entire surface of said semiconductor substrate including said gate electrode; and a nitride film having a predetermined thickness and formed on said first insulating underlayer so as to set a distance between said nitride film and said gate insulating film to be not less than 20 times the thickness of said nitride film.

2. A device according to claim 1, wherein a thickness of said first insulating underlayer is set to be not less than 20 times the thickness of said nitride film.

3. A device according to claim 1, wherein the thickness of said nitride film is set to be 5 to 20 nm.

4. A device according to claim 1, further comprising a second insulating interlayer formed on said nitride film, contact holes formed in said first and second insulating interlayer and said nitride film to reach the surface of said semiconductor substrate in correspondence with regions of said source and said drain, and an interconnection layer selectively formed on said second insulating interlayer including said contact holes.

5. A device according to claim 1, wherein said semiconductor device comprises a MOS (Metal Oxide Semiconductor) transistor having an LDD (Light Doped Drain) structure.

6. A semiconductor device, comprising:

a substrate;

operative components formed on said substrate;

a first insulating layer formed on said components; and a nitride film formed on said first insulating layer.

7. A semiconductor device, according to claim 6, wherein a thickness of said first insulating layer is at least twenty times a thickness of said nitride film.

8. A semiconductor device, according to claim 7, wherein the thickness of said nitride film is greater than approximately five nm.

9. A semiconductor device, according to claim 8, wherein the thickness of said nitride film is less than approximately twenty nm.

10. A semiconductor device, according to claim 9, wherein the thickness of said first insulating layer is at least twenty-five times the thickness of said nitride film.

11. A semiconductor device, according to claim 6, wherein said operative components include a MOS transistor having a source region and a drain region.

12. A semiconductor device, according to claim 11, further comprising:

a second insulating layer formed on said nitride film; and first and second contact holes formed in said insulating layers and said nitride film over said source and drain regions, respectively.

* * * * *